(12) United States Patent
Yoshioka (10) Patent No.: US 9,973,201 B2
(45) Date of Patent: May 15, 2018

(54) SEMICONDUCTOR DEVICE

(71) Applicant: Renesas Electronics Corporation, Tokyo (JP)

(72) Inventor: Yuki Yoshioka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/654,484

(22) Filed: Jul. 19, 2017

(65) Prior Publication Data

US 2018/0091167 A1    Mar. 29, 2018

(30) Foreign Application Priority Data

Sep. 23, 2016    (JP) .................................. 2016-185267

(51) Int. Cl.
*H03M 1/12* (2006.01)
*H03M 1/46* (2006.01)
*H02M 3/156* (2006.01)

(52) U.S. Cl.
CPC ........... *H03M 1/462* (2013.01); *H02M 3/156* (2013.01); *H03M 1/1245* (2013.01); *H03M 1/468* (2013.01)

(58) Field of Classification Search
CPC ..... H02M 3/156; H03M 1/468; H03M 1/1245
USPC ........................................ 341/155, 161, 144
See application file for complete search history.

(56) References Cited

U.S. PATENT DOCUMENTS

| | | | | | |
|---|---|---|---|---|---|
| 5,336,915 | A | * | 8/1994 | Fujita | .................... H01L 27/088 257/369 |
| 7,554,158 | B2 | * | 6/2009 | Yamamoto | ............ H01L 21/761 257/355 |
| 7,777,293 | B2 | * | 8/2010 | Miyada | ............... H01L 23/5225 257/503 |
| 8,410,961 | B2 | | 4/2013 | Iwabuchi | |
| 9,438,260 | B1 | * | 9/2016 | Ebata | .................. H03M 1/1038 |

FOREIGN PATENT DOCUMENTS

JP    2012-029155 A    2/2012

* cited by examiner

*Primary Examiner* — Brian Young
(74) *Attorney, Agent, or Firm* — McGinn IP Law Group, PLLC (57) ABSTRACT

According to one aspect, a semiconductor device (1) includes: an input circuit (11_1) configured to receive an analog signal, the analog signal and a digital signal being selectively input; an input circuit (11_4) configured to be driven by a power supply common to the input circuit (11_1) and receive a digital signal, the digital signal and an analog signal being selectively input; an AD converter (15) configured to perform AD conversion of the analog signal input to the input circuit (11_1); an edge detection circuit (12) configured to detect an edge of the digital signal input to the input circuit (11_4); and a control unit (13) configured to execute predetermined processing on a result of the AD conversion by the AD converter (15) based on a result of the detection by the edge detection circuit (12).

10 Claims, 7 Drawing Sheets

SEMICONDUCTOR DEVICE

CROSS-REFERENCE TO RELATED APPLICATIONS

This application is based upon and claims the benefit of priority from Japanese patent application No. 2016-185267, filed on Sep. 23, 2016, the disclosure of which is incorporated herein in its entirety by reference.

BACKGROUND

The present disclosure relates to a semiconductor device. For example, the present disclosure relates to a semiconductor device suitable for receiving digital and analog signals accurately in a state where high general versatility is maintained.

Semiconductor systems such as a microcontroller mounted on a vehicle are required to receive not only digital signals, but also analog signals, depending on specifications. Semiconductor systems are also required to reduce the number of external terminals (pads) to thereby suppress an increase in circuit size. In addition, there is a demand for a microcomputer with high general versatility that can be used for a large number of applications without increasing the circuit size and the number of terminals.

Accordingly, in recent years, a semiconductor system incorporating an input circuit capable of selectively receiving digital and analog signals (digital/analog input circuit) has been developed. In the semiconductor system incorporating the digital/analog input circuit, pads are shared by the digital and analog signals. Accordingly, the number of pads is reduced, resulting in suppression of increase in circuit size.

However, in a semiconductor system incorporating a plurality of digital/analog input circuits that are driven by a common power supply, an edge of a digital signal input to a certain digital/analog input circuit is transmitted as noise to an analog signal input to another digital/analog input circuit via the common power supply. This causes a problem that the analog signal cannot be received accurately.

A solution to the above-mentioned problem is disclosed in Japanese Unexamined Patent Application Publication No. 2012-29155.

A semiconductor integrated circuit disclosed in Japanese Unexamined Patent Application Publication No. 2012-29155 includes resistor elements which have a resistance value depending on the type of a digital signal (a digital output signal or a digital input signal) and are disposed on an analog signal line that connects input terminals (pads), which are shared by digital and analog signals, to an AD converter that performs AD conversion of analog signals. With this configuration, the semiconductor integrated circuit reduces the effect of noise transmitted from the digital signal to the analog signal.

SUMMARY

However, in the configuration disclosed in Japanese Unexamined Patent Application Publication No. 2012-29155, components (e.g., resistor elements and the like) of a plurality of input/output circuit parts provided so as to respectively correspond to a plurality of pads need to be adjusted separately depending on specifications. This causes a problem that the general versatility deteriorates. Other problems to be solved by and novel features of the present disclosure become apparent from the following description and the accompanying drawings.

According to one embodiment, a semiconductor device includes: a first input circuit configured to receive a first analog signal, the first analog signal and a first digital signal being selectively input; a second input circuit configured to be driven by a power supply common to the first input circuit and receive a second digital signal, the second digital signal and a second analog signal being selectively input; an AD converter configured to perform AD conversion of the first analog signal input to the first input circuit; an edge detection circuit configured to detect an edge of the second digital signal input to the second input circuit; and a control unit configured to execute predetermined processing on a result of the AD conversion by the AD conversion based on a result of the detection by the edge detection circuit.

According to another embodiment, a semiconductor device includes: a first input circuit configured to receive an analog signal; a second input circuit configured to be driven by a power supply common to the first input circuit and receive a digital signal; an AD converter configured to perform AD conversion of the analog signal input to the first input circuit; an edge detection circuit configured to detect an edge of the digital signal input to the second input circuit; and a control unit configured to acquire a result of the AD conversion by the AD converter when no edge is detected by the edge detection circuit during the AD conversion by the AD converter.

According to still another embodiment, a semiconductor device includes: a first input circuit configured to receive an analog signal; a second input circuit configured to be driven by a power supply common to the first input circuit and receive a digital signal; an AD converter configured to perform AD conversion of the analog signal input to the first input circuit; an edge detection circuit configured to detect an edge of the digital signal input to the second input circuit; and a control unit configured to acquire m (m is an integer equal to or greater than 2) successive AD conversion results obtained by the AD converter and average the AD conversion results, and acquire, as reliability information, the number of times when an edge is detected by the edge detection circuit in the m times of AD conversion.

It is possible to provide a semiconductor device capable of receiving digital and analog signals accurately in a state where high general versatility is maintained.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments will be described below with reference to the drawings. The drawings are made in a simplified manner, and therefore the technical scope of embodiments should not be narrowly interpreted based on the drawings. The same elements are denoted by the same reference numerals, and repeated explanations thereof are omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of some or all of the other, unless otherwise specified. Further, in the following embodiments, when the number of elements (including the number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated or it is theoretically clear that the above is not true. This also applies to the above-mentioned values (including the number of items, numerical value, quantity, range, etc.) and the like.

First Embodiment

Figure 1:
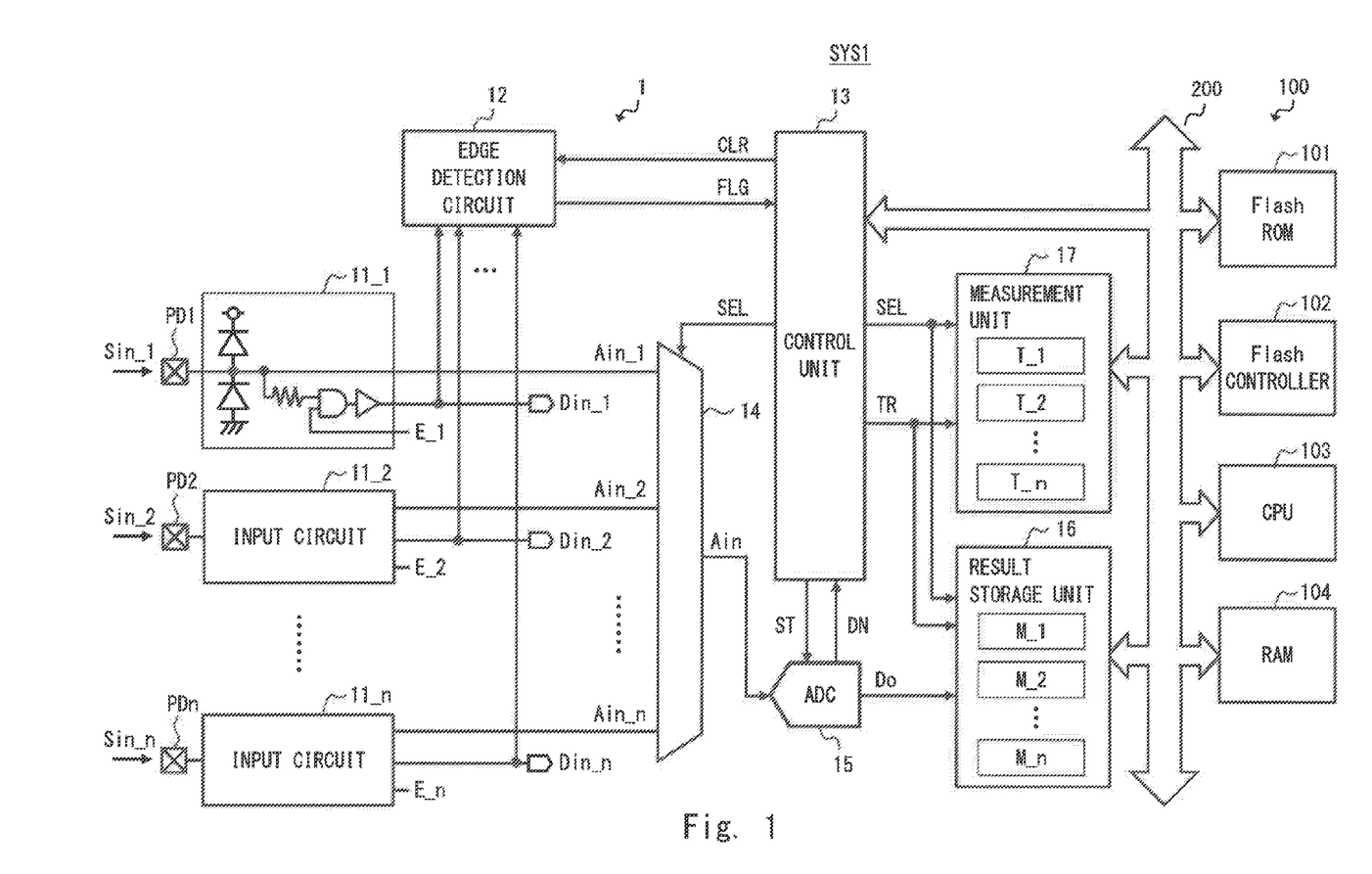
FIG. 1 is a block diagram showing a configuration example of a semiconductor system on which a semiconductor device according to a first embodiment is mounted.

FIG. 1 is a block diagram showing a configuration example of a semiconductor system SYS1 on which a semiconductor device 1 according to a first embodiment is mounted. The semiconductor system SYS1 is, for example, a microcontroller mounted on a vehicle. The semiconductor device 1 is a circuit that executes predetermined processing on signals that are externally supplied to the microcomputer. In this case, the semiconductor device 1 acquires, as formal data, a result of AD conversion of an analog signal only when no edge of a digital signal input to a certain digital/analog input circuit is detected during the AD conversion of the analog signal input to another digital/analog input circuit. Accordingly, there is no need for the semiconductor device 1 according to this embodiment to adjust the configurations of a plurality of digital/analog input circuits depending on specifications. Consequently, the semiconductor device 1 according to this embodiment can receive digital and analog signals accurately in a state where high general versatility is maintained. Details thereof will be described below.

As shown in FIG. 1, the semiconductor system SYS1 includes a flash ROM (Read Only Memory) 101, a flash controller 102, a CPU (Central Processing Unit) 103, a RAM (Random Access Memory) 104, the semiconductor device 1, and a bus 100 that connects these components.

The semiconductor device 1 performs predetermined processing on a digital signal externally supplied, and also performs predetermined processing by performing AD conversion of an externally supplied analog signal into a digital signal. In this case, the semiconductor device 1 is configured to be able to selectively receive digital and analog signals of n (n is an integer equal to or greater than 2) channels in total. Thus, the semiconductor device 1 can adjust the number of channels for receiving the digital signal and the number of channels for receiving the analog signal depending on the specifications, which leads to an improvement in general versatility.

(Configuration Example of the Semiconductor Device 1)

Specifically, the semiconductor device 1 includes n pads PD1 to PDn, n digital/analog input circuits (hereinafter referred to simply as input circuits) 11_1 to 11_n, an edge detection circuit 12, a control unit 13, a selection circuit 14, an AD converter 15, a result storage unit 16, and a measurement unit 17. The input circuits 11_1 to 11_n are each configured to be able to selectively receive digital and analog signals.

An input circuit 11_i (i is an arbitrary integer from 1 to n) outputs a digital or analog input signal Sin_i, which is externally supplied to a pad PD_i, as an analog signal Ain_i or a digital signal Din_i, from an analog output terminal or a digital output terminal which is selected based on an enable signal E_i.

For example, when the input signal Sin_i is an analog signal, the input circuit 11_i is supplied with the enable signal E_i of L level from the control unit 13. Accordingly, the input circuit 11_i outputs the analog signal Ain_i from the analog output terminal. On the other hand, when the input signal Sin_i is a digital signal, the input circuit 11_i is supplied with the enable signal E_i of H level from the control unit 13. Accordingly, the input circuit 11_i outputs the digital signal Din_i from the digital output terminal.

(Specific Configuration Example of the Input Circuits 11_1 to 11_n)

Figure 2:
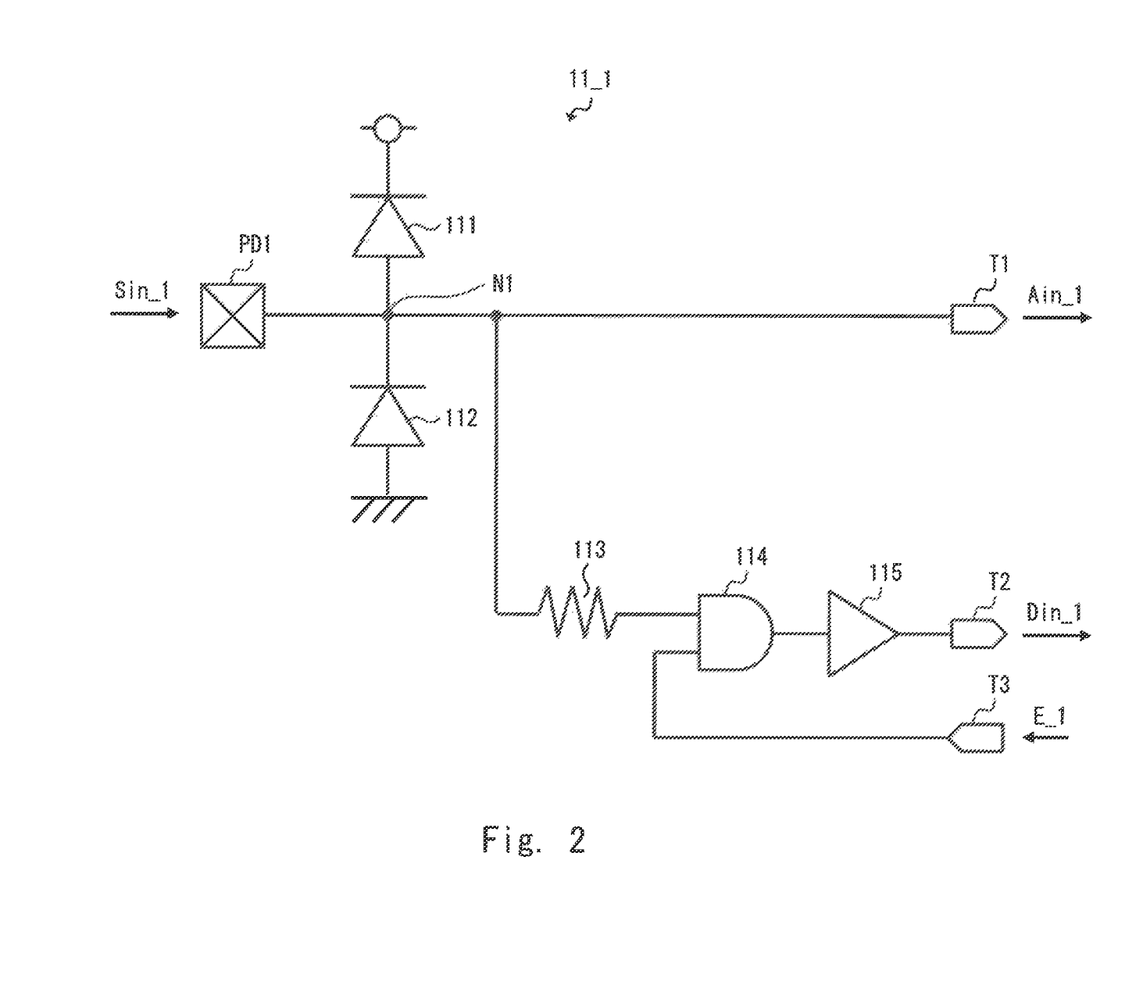
FIG. 2 is a diagram showing a specific configuration example of an input circuit provided in the semiconductor device shown in FIG. 1.

FIG. 2 is a diagram showing a specific configuration example of the input circuit 11_1.

As shown in FIG. 2, the input circuit 11_1 includes diodes 111 and 112, a protective resistance 113, an AND circuit 114, and a level shifter 115. FIG. 2 also illustrates the pad PD1.

The diodes 111 and 112 are diodes for ESD protection. An anode of the diode 111 is connected to a node N1 on a signal line that connects the pad PD1 to an analog output terminal T1 of the input circuit 11_1, and a cathode of the diode 111 is connected to a power supply VDD. An anode of the diode 112 is connected to a ground GND and a cathode of the diode 112 is connected to the node N1.

For example, when a voltage VN1 of an input signal Sin_1 which is externally supplied to the pad PD1 is equal to or higher than a voltage of the power supply VDD (hereinafter also referred to as a power supply voltage VDD), the voltage VN1 decreases to the power supply voltage VDD. On the other hand, when the voltage VN1 is less than a voltage of the ground GND (hereinafter also referred to as a ground voltage GND), the voltage VN1 increases to the ground voltage GND. Note that, to simplify the explanation, a voltage drop of each of the diodes 111 and 112 is not taken into consideration. Thus, an excessive rise or an excessive drop of the voltage VN1 at the node N1 due to static electricity or the like can be prevented.

The AND circuit 114 outputs an AND between the input signal Sin_1 supplied via the protective resistance 113 and an enable signal E_1 which is supplied to an input terminal T3 of the input circuit 11_1. The level shifter 115 decreases the voltage level of the output signal of the AND circuit 114 to a level of a drive voltage of a subsequent-stage internal circuit (not shown).

For example, when the input signal Sin_1 is an analog signal, the analog input signal Sin_1, which is externally supplied to the pad PD1, is outputs as an analog signal Ain_1 from the analog output terminal T1 of the input circuit 11_1. At this time, the enable signal E_1 is controlled to become the L level, so that the AND circuit 114 outputs an L level signal, regardless of the voltage level of the input signal Sin_1. Accordingly, the voltage at a digital output terminal T2 of the input circuit 11_1 is fixed to the L level.

On the other hand, when the input signal Sin_1 is a digital signal, the enable signal E_1 is controlled to become the H level, so that the AND circuit 114 outputs the input signal Sin_1 as it is. The level shifter 115 decreases the voltage level of the output signal of the AND circuit 114 to the level of the drive voltage of the subsequent-stage internal circuit. Specifically, after the level of the digital input signal Sin_1 which is externally supplied to the pad PD1 is shifted, the digital input signal Sin_1 is output as a digital signal Din_1 from the digital output terminal T2 of the input circuit 11_1.

The configuration of the input circuit 11_1 is not limited to the configuration shown in FIG. 2 and can be changed, as appropriate, to another configuration having similar functions.

The configurations of the input circuits 11_n to 11_n are similar to the configuration of the input circuit 11_1, and thus the descriptions thereof are omitted.

In this case, the input circuits 11_1 to 11_n are driven by the power supply voltage VDD and the ground voltage GND which are common to the input circuits. Accordingly, there is a possibility that an edge of the digital signal input to any one of the input circuits may be transmitted as noise to the analog signal input to another input circuit via the power supply.

Referring again to FIG. 1, digital signals Din_1 to Din_n output from the input circuits 11_1 to 11_n, respectively, are supplied to the internal circuit (not shown) and the edge detection circuit 12.

The edge detection circuit 12 detects edges (a rising edge and a falling edge) of each of the digital signals Din_1 to Din_n, and outputs the detection result as a flag signal FLG.

For example, when a clear signal CLR supplied from the control unit 13 is active, the edge detection circuit 12 initializes the flag signal FLG to be inactive (e.g., L level). After that, when the edge detection circuit 12 detects an edge of any one of the digital signals Din_1 to Din_n, the edge detection circuit 12 activates the flag signal FLG (e.g., H level).

(Specific Configuration Example of the Edge Detection Circuit 12)

Figure 3:
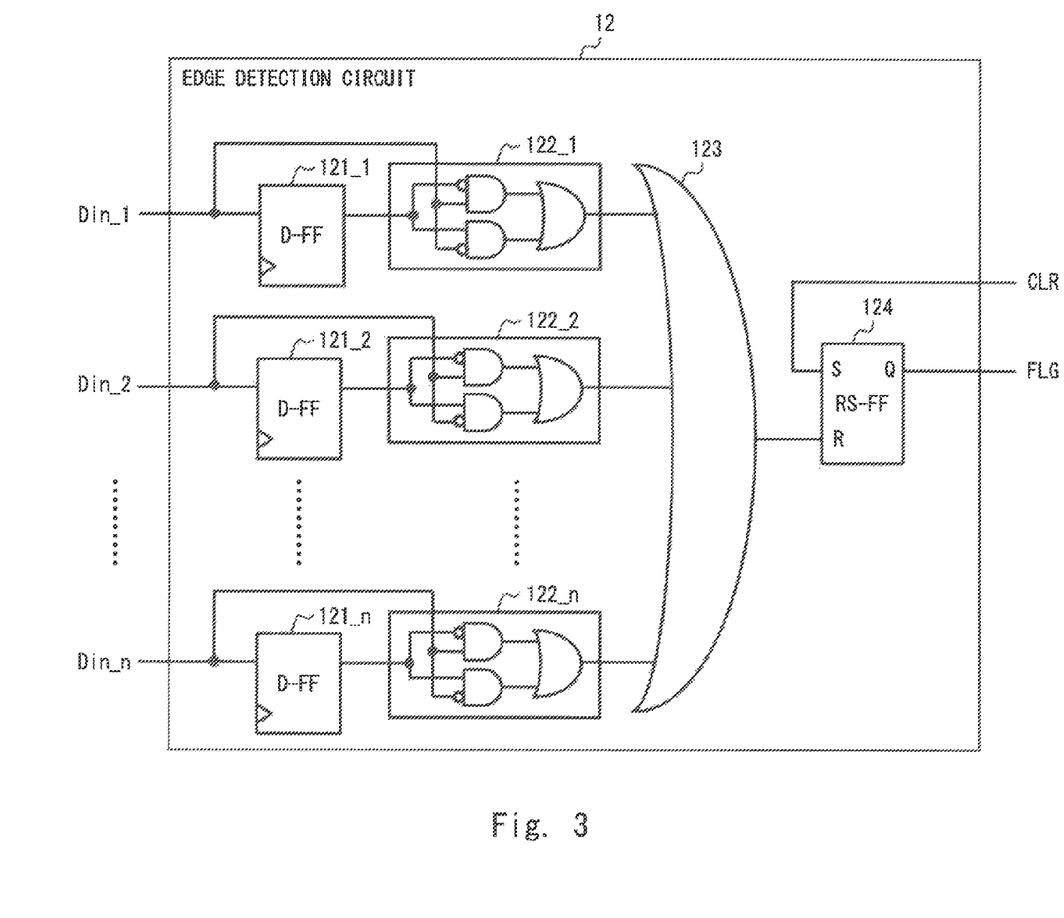
FIG. 3 is a diagram showing a specific configuration example of an edge detection circuit provided in the semiconductor device shown in FIG. 1.

FIG. 3 is a diagram showing a specific configuration example of the edge detection circuit 12.

As shown in FIG. 3, the edge detection circuit 12 includes D flip-flops 121_1 to 121_n, combinational circuits 122_1 to 122_n, an OR circuit 123, and an RS flip-flop 124.

The D flip-flops 121_1 to 121_n acquire the digital signals Din_1 to Din_n, respectively, in synchronization with a clock signal.

The combinational circuits 122_1 to 122_n output logical operation results corresponding to the digital signals Din_1 to Din_n and output signals of the D flip-flops 121_1 to 121_n, respectively. Specifically, a combinational circuit 122_i (i is an arbitrary integer from 1 to n) outputs an OR between the AND between the digital signal Din_i and an inverted signal of the output signal of a D flip-flop 121_i and the AND between an inverted signal of the digital signal Din_i and the output signal of the D flip-flop 121_i.

The OR circuit 123 outputs an OR between the output signals of the respective combinational circuits 122_1 to 122_n.

A reset terminal R of the RS flip-flop 124 receives the output signal of the OR circuit 123; a set terminal S of the RS flip-flop 124 receives the clear signal CLR from the control unit 13; and an output terminal Q of the RS flip-flop 124 outputs the flag signal FLG.

The configuration of the edge detection circuit 12 is not limited to the configuration shown in FIG. 3 and can be changed, as appropriate, to another configuration having similar functions.

Referring again to FIG. 1, the selection circuit 14 selects any one of analog signals Ain_1 to Ain_n based on a selection signal SEL from the control unit 13, and outputs the selected analog signal as an analog signal Ain. In other words, the selection circuit 14 outputs, as the analog signal Ain, an analog signal of a channel designated by the selection signal SEL from the control unit 13 from among the analog signals Ain_1 to Ain_n.

The AD converter 15 performs AD conversion of the analog signal Ain output from the selection circuit 14 and outputs a digital signal Do. When a start signal ST supplied from the control unit 13 is active, the AD converter 15 starts the AD conversion, and when the AD conversion is completed, the AD converter 15 activates a completion signal DN.

The result storage unit 16 includes n storage regions M_1 to M_n respectively corresponding to the n input circuits 11_1 to 11_n. When a trigger signal TR supplied from the control unit 13 is active, the AD conversion result (digital signal Do) is stored in the storage region designated by the selection signal SEL from the control unit 13 from among the storage regions M_1 to M_n. The AD conversion results (digital signal Do) of the analog signals Ain_1 to Ain_n are hereinafter also referred to as digital signals Do_1 to Din_n, respectively.

The measurement unit 17 includes n timers T_1 to T_n respectively corresponding to the n input circuits 11_1 to 11_n. When the trigger signal TR supplied from the control unit 13 is active, the measurement unit 17 causes the timer designated by the selection signal SEL from the control unit 13 to start measurement (count-up).

Specifically, when the trigger signal TR is active, the AD conversion result (digital signal Do) is stored in the storage region designated by the selection signal SEL from among the storage regions M_1 to M_n, and the timer designated by the selection signal SEL from among the timers T_1 to T_n starts measurement (count-up). Accordingly, a period for storing the AD conversion result can be recognized from the measured value of the timer.

The control unit 13 controls the operation of each functional block of the semiconductor device 1. Details of the control unit 13 will be described later.

The flash controller 102 controls information about AD conversion, which is input by a user's operation, to be written into the flash ROM 101. Thus, for example, information indicating whether or not to employ a method for reducing noise in an analog signal, information about the input signals Sin_1 to Sin_n that are externally supplied to the pads PD1 to PDn, respectively, and information about an AD conversion procedure, and the like are stored in the flash ROM 101. Since the information about AD conversion is stored in the flash ROM 101, the information about AD conversion is held even after power-off, which eliminates the need for reconfiguration.

The CPU 103 executes arithmetic processing in accordance with programs stored in the RAM 104. The RAM 104 stores the above-mentioned programs, operation results of the CPU 103, and the like. Peripheral circuits such as the semiconductor device 1 execute predetermined processing in accordance with instructions from the CPU 103. In this example, the information about AD conversion is read out from the flash ROM 101, and the control content corresponding to the information is set in the control unit 13.

(Operation of the Semiconductor Device 1)

Next, the operation of the semiconductor device 1 will be described with reference to FIGS. 1, 4, and 5.

Figure 4:
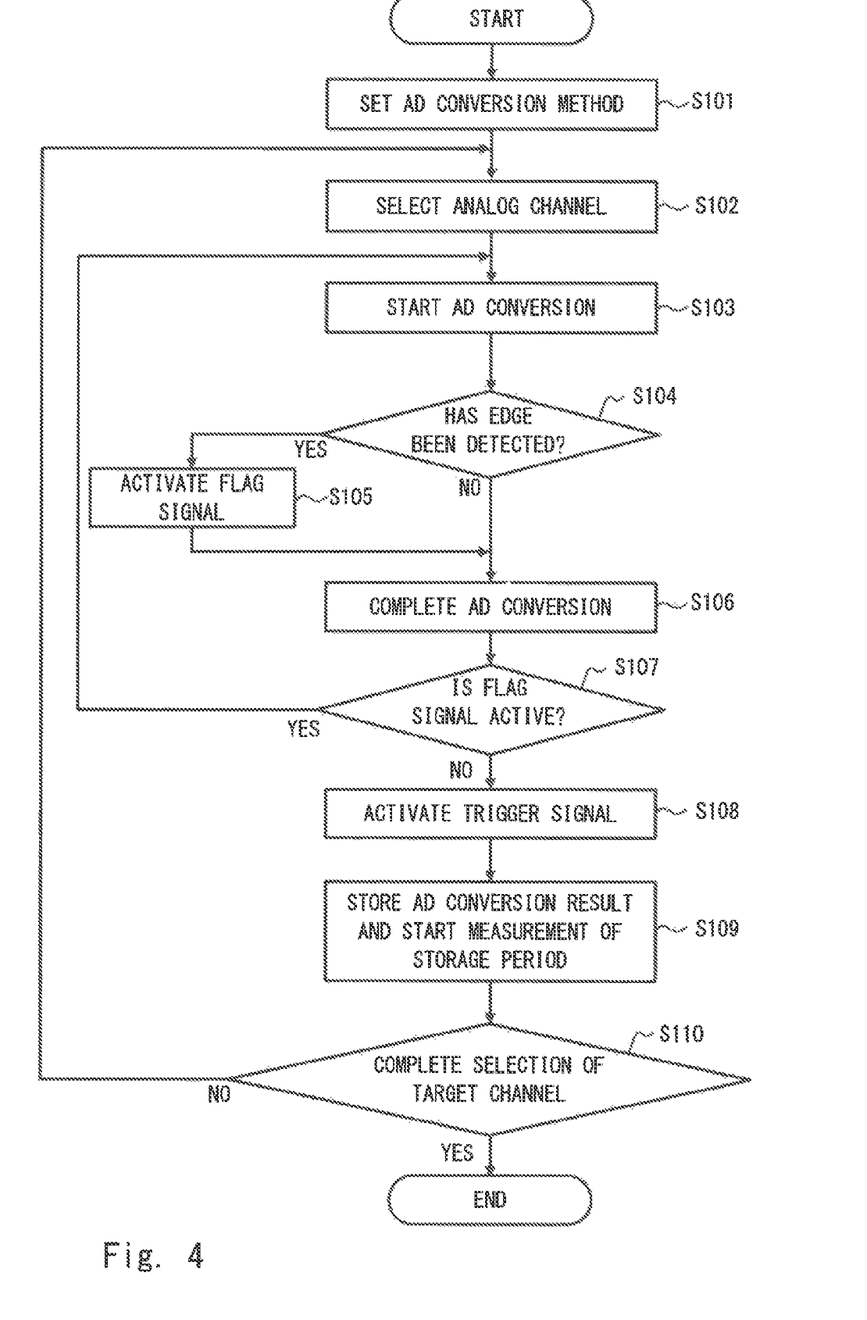
FIG. 4 is a flowchart showing an operation of the semiconductor device shown in FIG. 1.

FIG. 4 is a flowchart showing the operation of the semiconductor device 1.

Figure 5:
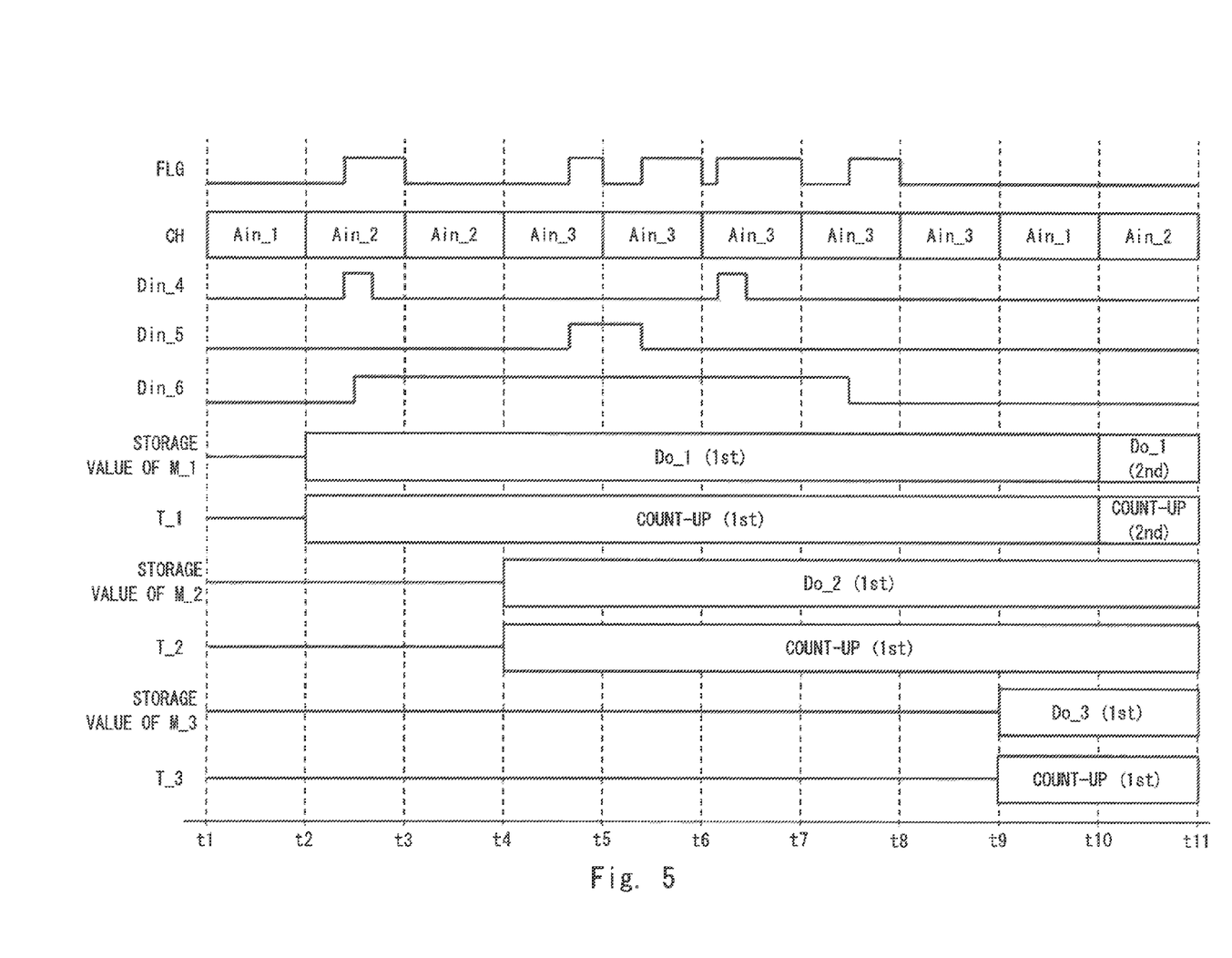
FIG. 5 is a timing diagram showing an operation of the semiconductor device shown in FIG. 1.

FIG. 5 is a timing diagram showing the operation of the semiconductor device 1.

A case where n=6 will be described below by way of example. Specifically, a case where six input circuits 11_1 to 11_6 are provided will be described below by way of example. Further, a case where the analog input signals Sin_1 to Sin_3 are input to the input circuits 11_1 to 11_3, respectively, the input signals Sin_4 to Sin_6 are input to the input circuits 11_4 to 11_6, respectively, will be described below by way of example. Accordingly, the input circuits 11_1 to 11_3 output the analog signals Ain_1 to Ain_3, respectively, and the input circuits 11_4 to 11_6 output the digital signals Din_4 to Din_6, respectively.

First, the information about AD conversion stored in the flash ROM is read out and the control content corresponding to the information is set in the control unit 13 (step S101).

After that, the control unit 13 selects a channel to be subjected to AD conversion (step S102). Specifically, the control unit 13 generates the selection signal SEL and outputs the selection signal SEL to the selection circuit 14. Accordingly, the selection circuit 14 outputs, as the analog signal Ain, an analog signal of a channel designated by the selection signal SEL from among the analog signals Ain_1 to Ain_3.

In the example shown in FIG. 5, the selection circuit 14 selects the analog signal Ain_1 (time t1).

After that, the control unit 13 initializes the flag signal FLG and then causes the AD converter 15 to start the AD conversion (step S103).

Specifically, the control unit 13 activates the clear signal CLR to initialize the flag signal FLG output from the edge detection circuit 12 to be inactive (L level). After that, the control unit 13 activates the start signal ST and causes the AD converter 15 to start the AD conversion. When the AD converter 15 completes the AD conversion, the AD converter 15 activates the completion signal DN and returns the completion signal DN to the control unit 13 (step S106).

In this case, when no edge is detected (NO in step S104) during the AD conversion (more specifically, during a period from a time when the start signal ST is activated to a time when the completion signal DN is activated), the edge detection circuit 12 maintains the flag signal FLG in the inactive state (L level). On the other hand, when an edge of any one of the digital signals Din_4 to Din_6 is detected (YES in step S104), the edge detection circuit 12 sets the flag signal FLG to be active (H level) (step S105).

When the flag signal FLG is maintained at the L level (NO in step S107), the control unit 13 acquires, as formal data, the AD conversion result obtained by the AD converter 15 (steps S108 and S109).

Specifically, when the flag signal FLG is at the L level after the AD conversion (NO in step S107), the control unit 13 activates the trigger signal TR (step S108). Accordingly, the AD conversion result is stored in the storage region designated by the selection signal SEL from among the storage regions M_1 to M_n of the result storage unit 16, and the timer designated by the selection signal SEL from among the timers T_1 to T_n of the measurement unit 17 starts measurement (step S109).

On the other hand, when the flag signal FLG is at the H level (YES in step S107), the control unit 13 does not acquire the AD conversion result obtained by the AD converter 15 and repeats the processing of steps S103 to S107 again.

Specifically, when the flag signal FLG is at the H level after the AD conversion (YES in step S107), the control unit 13 maintains the trigger signal TR in the inactive state. Accordingly, the AD conversion result is not stored in any of the storage regions, and no timer starts measurement. After the control unit 13 initializes the flag signal FLG to the L level, the control unit 13 repeats the processing of steps S103 to S107 again.

In the example shown in FIG. 5, since the flag signal FLG is maintained at the L level, the digital signal Do_1 indicating the AD conversion result of the analog signal Ain_1 is stored in the storage region M_1 and the timer T_1 starts measurement (time t2).

After that, when the selection of channels to be subjected to AD conversion is not completed (NO in step S110), the processing of steps S102 to S110 is repeated again, and when the selection of all channels to be subjected to AD conversion is completed (YES in step S110), the AD conversion operation is terminated.

In the example of FIG. 5, the selection of channels to be subjected to AD conversion is not completed (NO in step S110). Accordingly, the processing returns to step S102 and the analog signal Ain_2 is selected instead of the analog signal Ain_1 (time t2). In the subsequent processing of steps S103 to S107, the following operation is carried out.

Specifically, during the first AD conversion of the analog signal Ain_2, edges of the digital signals Din_4 and Din_6 are detected and the flag signal FLG is at the H level (times t2 to t3). Accordingly, the result of the first AD conversion of the analog signal Ain_2 is not stored in any of the storage regions and no timer starts measurement (time t3). After the flag signal FLG is initialized to the L level, the AD conversion of the analog signal Ain_2 is performed again (times t3 to t4).

During the second AD conversion of the analog signal Ain_2, no edge of the digital signals Din_4 to Din_6 is detected and the flag signal FLG is maintained at the L level (times t3 to t4). Accordingly, the digital signal Do_2 indicating the result of the second AD conversion of the analog signal Ain_2 is stored in the storage region M_2 and the timer T_2 starts measurement (count-up) (time t4).

In the example shown in FIG. 5, after that, the analog signal Ain_3 is selected instead of the analog signal Ain_2 (time t4). During the first to fourth successive AD conversions of the analog signal Ain_3, an edge of any one of the digital signals Din_4 to Din_6 is detected and the flag signal FLG is at the H level (times t4 to t5, t5 to t6, t6 to t7, and t7 to t8). Accordingly, the results of the first to fourth successive AD conversions of the analog signal Ain_3 are not stored in any of the storage regions, and no timer starts measurement (times t5, t6, t7, and t8).

During the fifth AD conversion of the analog signal Ain_3, no edge of the digital signals Din_4 to Din_6 is detected and the flag signal FLG is maintained at the L level (times t8 to t9). Accordingly, the digital signal Do_3 indicating the result of the fifth AD conversion of the analog signal Ain_3 is stored in the storage region M_3 and the timer T_3 starts measurement (count-up) (time t9).

In the example shown in FIG. 5, after that, the analog signal Ain_1 is selected instead of the analog signal Ain_3 (time t9). During the AD conversion of the analog signal Ain_1, no edge of the digital signals Din_4 to Din_6 is detected and the flag signal FLG is maintained at the L level (times t9 to t10). Accordingly, the digital signal Do_1 indicating the result of the AD conversion of the analog signal Ain_1 is newly stored in the storage region M_1 and the timer T_1 newly starts measurement (count-up) (time t10).

Thus, in the semiconductor device 1 according to this embodiment, the AD conversion result of an analog signal is acquired as formal data only when no edge of a digital signal input to a certain digital/analog input circuit is detected during the AD conversion of an analog signal input to another digital/analog input circuit. Therefore, there is no need for the semiconductor device 1 according to this embodiment to adjust the configurations (e.g., the resistance value of the protective resistance) of the plurality of digital/analog input circuits separately depending on the specifications, so that the semiconductor device can receive the digital and analog signals accurately in a state where high general versatility is maintained.

Further, there is no need for the semiconductor device 1 according to this embodiment to redesign the digital/analog input circuits, or separately design a power supply for driving digital signals and a power supply for driving analog signals. Thus, the semiconductor device 1 can be implemented using simple logic circuits.

Note that when there is no need to avoid noise in an analog signal generated due to an edge of a digital signal, setting information for instructing to constantly maintain the trigger signal TR in the active state may be written into the flash ROM 101. As a result, the trigger signal TR is constantly maintained in the active state, and thus the AD conversion result is stored in the designated storage region of the result storage unit 16 as formal data every time the AD conversion is completed.

Second Embodiment

Figure 6:
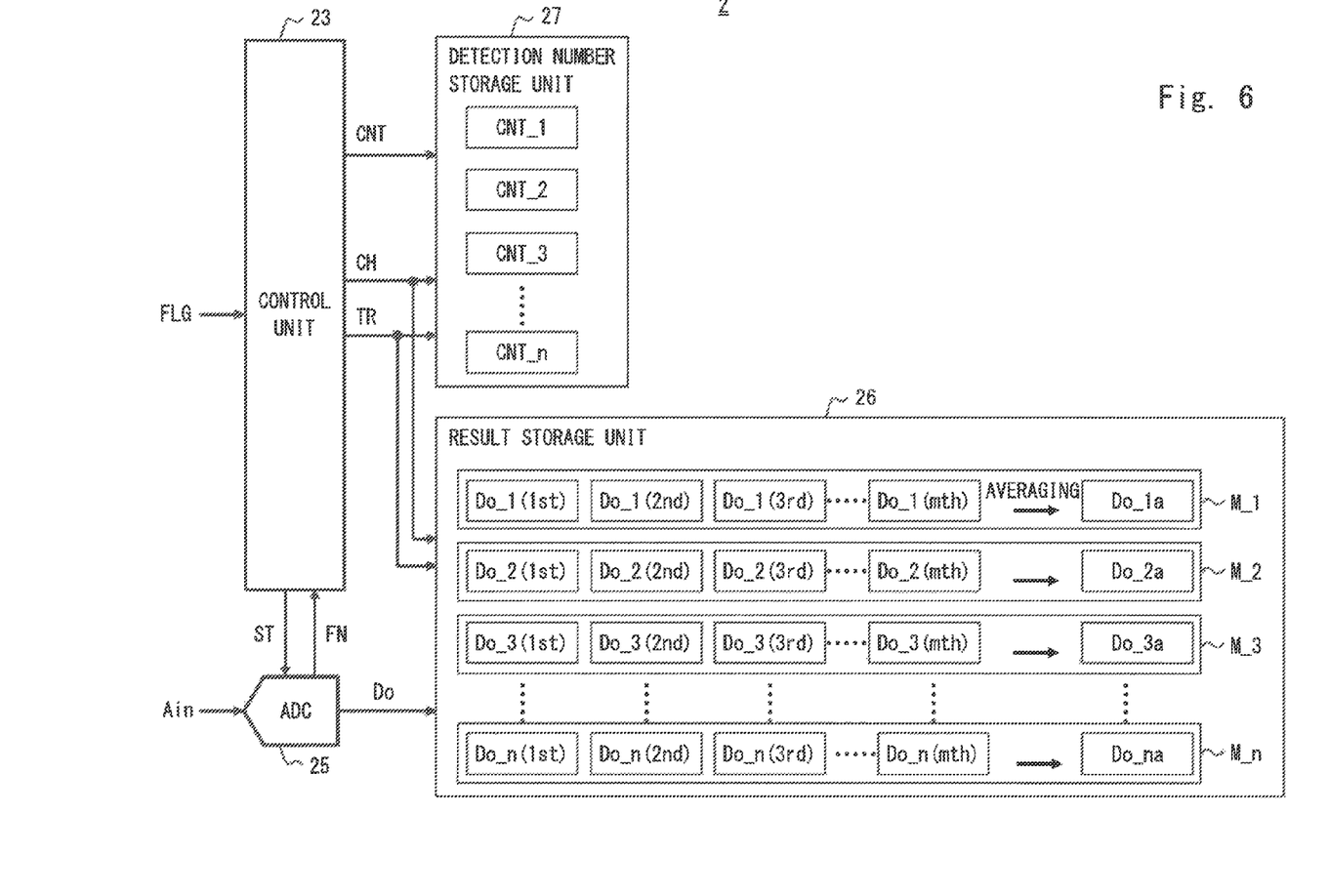
FIG. 6 is a block diagram showing a configuration example of a semiconductor device according to a second embodiment.

FIG. 6 is a diagram showing a configuration example of a semiconductor device 2 according to a second embodiment.

The semiconductor device 2 according to this embodiment acquires m (m is an integer equal to or greater than 2) successive AD conversion results of the analog signal Ain and averages the AD conversion results. Thus, the semiconductor device 2 according to this embodiment can alleviate the deterioration in AD conversion accuracy due to noise. Further, the semiconductor device 2 according to this embodiment counts the number of times when an edge of a digital signal is detected in the m times of AD conversion, and acquires the counting result as reliability information. As a result, the semiconductor device 2 according to this embodiment can adopt, for example, only a reliable average value of the AD conversion results as formal data. Details thereof will be described below.

As shown in FIG. 6, the semiconductor device 2 includes the pads PD1 to PDn (not shown), the input circuits 11_1 to 11_n, the edge detection circuit 12, the selection circuit 14, a control unit 23, an AD converter 25, a result storage unit 26, and a detection number storage unit 27. The control unit 23, the AD converter 25, and the result storage unit 26 correspond to the control unit 13, the AD converter 15, and the result storage unit 16, respectively.

The control unit 23 causes the AD converter 25 to successively execute the AD conversion of the analog signal Ain m times. The control unit 23 activates the trigger signal TR every time the AD conversion is completed, regardless of the state of the flag signal FLG. Accordingly, all the m AD conversion results (m digital signals Do_1) are stored in the storage region M_1 of the result storage unit 26 that is selected by the selection signal SEL. An average value (digital signal Do_1a) of the m AD conversion results is also stored in the storage region.

Further, the control unit 23 counts the number of times when the flag signal FLG is activated (hereinafter also referred to as an edge detection number CNT) in the m times of AD conversion performed by the AD converter 25. As the edge detection number CNT decreases, the number of times of AD conversion affected by an edge of the digital signal in the m times of AD conversion decreases. Accordingly, the reliability of the average value of the m AD conversion results increases. On the other hand, as the edge detection number CNT increases, the number of times of AD conversion affected by an edge of the digital signal in the m times of AD conversion increases. Accordingly, the reliability of the average value of the m AD conversion results decreases. The edge detection number CNT is stored, as the reliability information, in the storage region selected by the selection signal SEL from among the storage regions CNT_1 to CNT_n of the detection number storage unit 27.

The other components of the semiconductor device 2 are similar to those of the semiconductor device 1, and thus the descriptions thereof are omitted.

The above embodiment illustrates a case where the control unit 23 has a function of counting the number of times when an edge of a digital signal is detected. However, this function is not particularly limited. The function of counting the number of times when an edge of a digital signal is detected may be separately provided.

(Operation of the Semiconductor Device 2)

Next, the operation of the semiconductor device 2 will be described with reference to FIGS. 6 and 7.

Figure 7:
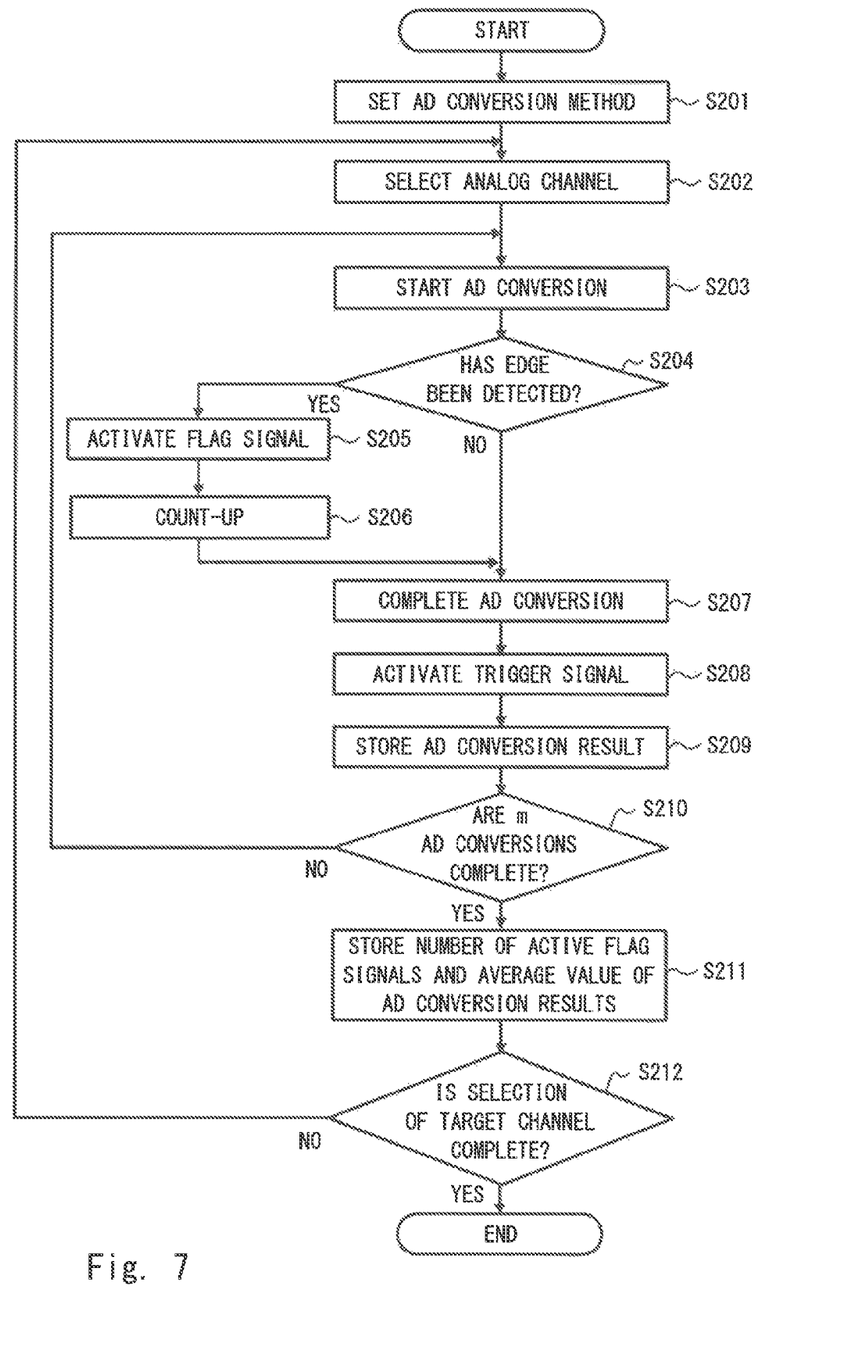
FIG. 7 is a flowchart showing an operation of the semiconductor device shown in FIG. 6.

FIG. 7 is a flowchart showing the operation of the semiconductor device 2.

A case where n=6 will be described below by way of example. Specifically, a case where six input circuits 11_1 to 11_6 are provided will be described below by way of example. Further, a case where the analog input signals Sin_1 to Sin_3 are input to the input circuits 11_1 to 11_3, respectively, and the digital input signals Sin_4 to Sin_6 are input to the input circuits 11_4 to 11_6, respectively, will be described below by way of example. Accordingly, the input circuits 11_1 to 11_3 output the analog signals Ain_1 to Ain_3, respectively, and the input circuits 11_4 to 11_6 output the digital signals Din_4 to Din_6, respectively.

First, the information about AD conversion stored in the flash ROM is read out and the control content corresponding to the information is set in the control unit 23 (step S201).

After that, the control unit 23 initializes the edge detection number CNT and then selects a channel to be subjected to AD conversion (step S202).

Specifically, the control unit 23 initializes the edge detection number CNT to 0, the control unit 23 generates the selection signal SEL and outputs the selection signal SEL to the selection circuit 14. Accordingly, the selection circuit 14 outputs, as an analog signal Ain, an analog signal of a channel designated by the selection signal SEL from among the analog signals Ain_1 to Ain_3. For example, the selection circuit 14 first selects the analog signal Ain_1.

After that, the control unit 23 initializes the flag signal FLG, and then causes the AD converter 25 to start the AD conversion (step S203).

Specifically, the control unit 23 activates the clear signal CLR to initialize the flag signal FLG from the edge detection circuit 12 to be inactive and then activates the start signal ST, thereby causing the AD converter 25 to start the AD conversion. When the AD conversion is completed, the AD converter 25 activates the completion signal DN and returns the completion signal to the control unit 23 (step S207).

In this case, when no edge is detected during the AD conversion (NO in step S204), the edge detection circuit 12 maintains the flag signal FLG in the inactive state. At this time, the operation of counting up the edge detection number CNT is not carried out. On the other hand, when an edge of any one of the digital signals Din_4 to Din_6 is detected (YES in step S204), the edge detection circuit 12 activates the flag signal FLG (step S205). At this time, the control unit 23 counts up the edge detection number CNT by one (step S206).

After that, the control unit 23 activates the trigger signal TR (step S208), regardless of the state of the flag signal FLG after the AD conversion (i.e., regardless of whether or not an edge is detected by the edge detection circuit 12). As a result, the AD conversion result (digital signal Do_1) is stored in the storage region M_1 designated by the selection signal SEL from among the storage regions M_1 to M_n of the result storage unit 26 (step S209).

When the m times of successive AD conversion are not completed (NO in step S210), the processing of steps S203 to S210 is repeated in a state where the analog signal Ain_1 remains selected.

When the m times of successive AD conversion are completed (YES in step S210), the m AD conversion results stored in the storage region M_1 are averaged. The average value (digital signal Do_1a) of the m AD conversion results is stored in the storage region M_1 (step S211). Further, information about the edge detection number CNT is stored in the storage region CNT_1 which is designated by the selection signal SEL from among the storage regions CNT_1 to CNT_n of the detection number storage unit 27 (step S211).

After that, when the selection of channels to be subjected to AD conversion is not completed (NO in step S212), the processing of steps S202 to S212 is repeated again, and when the selection of all channels to be subjected to AD conversion is completed (YES in step S212), the AD conversion operation is terminated. For example, after the selection of the analog signal Ain_1 is completed, the analog signals Ain_2 and Ain_3 are sequentially selected and processing similar to that performed when the analog signal Ain_1 is selected is repeated.

Thus, the semiconductor device 2 according to this embodiment acquires m (m is an integer equal to or greater than 2) successive AD conversion results of the analog signal Ain and averages the AD conversion results. Therefore, the semiconductor device 2 according to this embodiment can alleviate the deterioration in AD conversion accuracy due to noise.

Further, the semiconductor device 2 according to this embodiment counts the number of times when an edge is detected in the m times of AD conversion and adopts the counting result as the reliability information. Accordingly, the semiconductor device 2 according to this embodiment can adopt, for example, only a reliable average value of the AD conversion result as formal data.

Further, the semiconductor device 2 according to this embodiment acquires the AD conversion result at a constant timing, regardless of whether or not an edge is detected by the edge detection circuit 12. Therefore, the semiconductor device 2 according to this embodiment can acquire the average value of the AD conversion results at a constant timing, without causing variations in the data acquisition timing.

As described above, the semiconductor devices according to the first and second embodiments and the semiconductor system including the semiconductor devices include an AD converter configured to perform AD conversion of an analog signal input to a certain digital/analog input circuit, and an edge detection circuit configured to detect an edge of a digital signal input to another digital/analog input circuit, and execute predetermined processing on a result of the AD conversion performed by the AD converter based a result of the detection by the edge detection circuit. This configuration eliminates the need for the semiconductor devices according to the first and second embodiments and the semiconductor system including the semiconductor devices to adjust the configurations (e.g., the resistance value of the protective resistance) of the plurality of digital/analog input circuits separately depending on the specifications, so that the digital and analog signals can be received accurately in a state where high general versatility is maintained.

More specifically, the semiconductor device according to the first embodiment and the semiconductor system including the semiconductor device acquire the AD conversion result of the analog signal only when no edge of a digital signal input to a certain digital/analog input signal is detected during the AD conversion of an analog signal input to another digital/analog input circuit. This configuration eliminates the need for the semiconductor device according to the first embodiment and the semiconductor system including the semiconductor device to adjust the configurations (e.g., the resistance value of the protective resistance) of the plurality of digital/analog input circuits separately depending on the specifications. Therefore, the digital and analog signals can be received accurately in a state where high general versatility is maintained.

Further, the semiconductor device according to the second embodiment and the semiconductor system including the semiconductor device average the m successive AD conversion results for the analog signal input to a certain digital/analog input circuit. Consequently, the semiconductor device according to the second embodiment and the semiconductor system including the semiconductor device can alleviate the deterioration in AD conversion accuracy due to noise.

Further, the semiconductor device according to the second embodiment and the semiconductor system including the semiconductor device count the number of times when an edge of a digital signal is detected in the m times of AD conversion and adopt the counting result as the reliability information. Therefore, the semiconductor device according to the second embodiment and the semiconductor system including the semiconductor device can adopt, for example, only a reliable average value of the AD conversion results as formal data.

Furthermore, the semiconductor device according to the second embodiment and the semiconductor system including the semiconductor device acquire the AD conversion result at a constant timing, regardless of whether or not an edge is detected by the edge detection circuit. Therefore, the semiconductor device according to the second embodiment and the semiconductor system including the semiconductor device can acquire the average value of the AD conversion results at a constant timing, without causing variations in the data acquisition timing.

The invention made by the present inventor has been described in detail above based on embodiments. However, the present disclosure is not limited to the above embodiments and can be modified in various ways without departing from the gist of the invention.

For example, the semiconductor devices according to the above embodiments may have a configuration in which the conductivity type (p-type or n-type) of a semiconductor substrate, a semiconductor layer, a diffusion layer (diffusion region), or the like is reversed. Accordingly, when one of the conductivity types, i.e., the n-type or the p-type, is referred as a first conductivity type and the other conductivity type is referred to as a second conductivity type, the first conductivity type may be the p-type and the second conductivity type may be the n-type. On the contrary, the first conductivity type may be the n-type and the second conductivity type may be the p-type.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a first input circuit configured to receive a first analog signal, the first analog signal and a first digital signal being selectively input;
a second input circuit configured to be driven by a power supply common to the first input circuit and receive a second digital signal, the second digital signal and a second analog signal being selectively input;
an AD converter configured to perform AD conversion of the first analog signal input to the first input circuit;
an edge detection circuit configured to detect an edge of the second digital signal input to the second input circuit; and
a control unit configured to execute predetermined processing on a result of the AD conversion by the AD conversion based on a result of the detection by the edge detection circuit.

2. The semiconductor device according to claim 1, further comprising a third input circuit configured to be driven by the power supply common to the first input circuit and receive a third digital signal, the third digital signal and a third analog signal being selectively input, wherein the edge detection circuit further detects an edge of the third digital signal input to the third input circuit, in addition to an edge of the second digital signal input to the second input circuit.

3. The semiconductor device according to claim 1, wherein the control unit acquires a result of the AD conversion by the AD converter when no edge is detected by the edge detection circuit during the AD conversion by the AD converter.

4. The semiconductor device according to claim 3, wherein the control unit does not acquire the result of the AD conversion by the AD converter when an edge is detected by the edge detection circuit during the AD conversion by the AD converter.

5. The semiconductor device according to claim 3, further comprising:
a result storage unit configured to store the AD conversion result acquired by the control unit; and
a measurement unit configured to measure a period in which the AD conversion result is stored in the result storage unit.

6. The semiconductor device according to claim 1, wherein the control unit acquires m (m is an integer equal to or greater than 2) successive AD conversion results obtained by the AD converter and averages the AD conversion results, and acquires, as reliability information, the number of times when an edge is detected by the edge detection circuit in the m times of AD conversion.

7. The semiconductor device according to claim 6, further comprising:
a result storage unit configured to store the m AD conversion results acquired by the control unit and an average value of the m AD conversion results; and
a counter configured to count the number of times when an edge is detected by the edge detection circuit in the m times of AD conversion.

8. A semiconductor device comprising:
a first input circuit configured to receive an analog signal;
a second input circuit configured to be driven by a power supply common to the first input circuit and receive a digital signal;
an AD converter configured to perform AD conversion of the analog signal input to the first input circuit;
an edge detection circuit configured to detect an edge of the digital signal input to the second input circuit and output a detection result; and
a control unit configured to receive the detection result, and acquire a result of the AD conversion by the AD converter when the detection result indicates that no edge is detected by the edge detection circuit during the AD conversion by the AD converter.

9. The semiconductor device according to claim 8, wherein the control unit does not acquire the result of the AD conversion by the AD converter when an edge is detected by the edge detection circuit during the AD conversion by the AD converter.

10. A semiconductor device comprising:
a first input circuit configured to receive an analog signal;
a second input circuit configured to be driven by a power supply common to the first input circuit and receive a digital signal;
an AD converter configured to perform AD conversion of the analog signal input to the first input circuit;
an edge detection circuit configured to detect an edge of the digital signal input to the second input circuit; and
a control unit configured to acquire m (m is an integer equal to or greater than 2) successive AD conversion results obtained by the AD converter and average the AD conversion results, and acquire, as reliability information, the number of times when an edge is detected by the edge detection circuit in the m times of AD conversion.

* * * * *